United States Patent [19]

Wong et al.

[11] Patent Number: 5,444,397
[45] Date of Patent: Aug. 22, 1995

[54] ALL-CMOS HIGH-IMPEDANCE OUTPUT BUFFER FOR A BUS DRIVEN BY MULTIPLE POWER-SUPPLY VOLTAGES

[75] Inventors: Anthony Y. Wong, Saratoga; David Kwong, Fremont; Lee Yang, Cupertino; Charles Hsiao, Fremont, all of Calif.

[73] Assignee: Pericom Semiconductor Corp., San Jose, Calif.

[21] Appl. No.: 318,238

[22] Filed: Oct. 5, 1994

[51] Int. Cl.$^6$ .................. H03K 19/0175; H03K 19/02
[52] U.S. Cl. ........................................ 326/81; 326/58; 326/27; 327/57
[58] Field of Search ............. 326/27, 58, 81; 327/534, 537, 546

[56] References Cited

U.S. PATENT DOCUMENTS

| | | | |
|---|---|---|---|
| 4,871,927 | 10/1989 | Dallavalle | 307/296.5 |
| 4,963,766 | 10/1990 | Lundberg | 307/451 |
| 5,117,129 | 5/1992 | Hoffman et al. | 307/443 |
| 5,144,165 | 7/1992 | Dhong | 326/80 |
| 5,266,849 | 11/1993 | Kitahara | 307/475 |
| 5,300,835 | 4/1994 | Assar | 307/475 |
| 5,381,061 | 1/1995 | Davis | 326/57 |

OTHER PUBLICATIONS

"Crossvolt Low Voltage Logic Series Databook", National Semiconductor Corp., 1994, pp. 1–13.

*Primary Examiner*—David R. Hudspeth
*Assistant Examiner*—Andrew Sanders
*Attorney, Agent, or Firm*—Stuart T. Auvinen

[57] ABSTRACT

An all-CMOS output buffer drives a bus that can operate at 3 volts and 5 volts. When in a high-impedance state, the output buffer draws little or no current. If the bus is driven to 5 volts by an external device, the high impedance output buffer is in danger of latch-up and distortion of the bus logic level since it only has a 3-volt power supply and does not use a charge pump or an extra 5-volt supply. A biasing circuit couples an N-well that contains p-channel transistors and a driver transistor to the bus driven to 5 volts. Thus the N-well is also driven to 5 volts, the voltage on the bus. The gate of the p-channel driver transistor in the high-impedance output buffer is also coupled to the N-well by another p-channel transistor, raising the gate potential to 5 volts. Thus the gate and body of the p-channel driver transistor is at 5 volts, eliminating reversing current and latch-up problems. A transmission gate isolates the gate of the p-channel driver transistor from the rest of the device's circuitry. The p-channel transistors of the transmission gate, bias circuitry, and driver transistor are located in the N-well, which is biased up to 5 volts only when necessary. Thus during normal operation, the N-well of the driver transistor is at 3 volts, eliminating a performance loss from the body effect. A logic gate increases the well bias and isolates the driver's gate only when necessary, when the bus is high and driven by a 5-volt device, and the output buffer is in high-impedance.

16 Claims, 3 Drawing Sheets

ALL-CMOS HIGH-IMPEDANCE OUTPUT BUFFER FOR A BUS DRIVEN BY MULTIPLE POWER-SUPPLY VOLTAGES

BACKGROUND OF THE INVENTION—FIELD OF THE INVENTION

This invention relates to output buffers, and more particularly to a CMOS output buffer for driving a dual-voltage bus at a higher voltage than the output buffer's power supply voltage.

BACKGROUND OF THE INVENTION—DESCRIPTION OF THE RELATED ART

Integrated circuit (IC) device geometries continue to be shrunk, achieving higher-density and higher-performance IC's. However, the old standard of using a five-volt (5 v) power supply causes undesirable side effects on these shrunk devices, since these smaller devices now must support the same 5-volt drop across a smaller electronic device. Thus the voltage drop per unit length increases, as does the electric field across a device. This increased electric field can cause undesirable side effects such as hot-electron device wear-out and non-linear device characteristics and decreased performance.

A new standard for power supplies of 3 volts has emerged to solve this problem. Switching from 5 volts to 3 volts results in a 34% reduction in the electric fields carried across a device such as a complementary metal-oxide-semiconductor (CMOS) transistor. The lower power-supply voltage significantly reduces adverse side effects and power consumption and heat generation.

However, it has not been possible to convert all of the myriads of electronic devices to the new 3-volt standard. Thus a system designer must often have to use an older 5-volt IC with a newer 3-volt IC. For example, a newer microprocessor may operate at 3 volts, while data buffers attached to that microprocessor may only be available in 5-volt IC's. In the communications field, a newer 3-volt device may have to drive a bus that is also driven by older 5-volt devices.

FIG. 1 illustrates a bus that must be driven by both 3-volt and 5-volt devices. Several drivers 10, 14, 16 can connect to bus 12. However, only one of drivers 10, 14, 16 will be driving bus 12 at any one time. The other drivers will be in a high-impedance state. For example, when driver 14 is driving data out onto bus 12, drivers 10 and 16 are in a high-impedance state and do not drive data out onto bus 12. A driver in a high-impedance state only draws a small amount of current from bus 12, otherwise it could alter the logic level appearing on bus 12. In fact, if it draws a large current when in a high-impedance state it could even damage the driver.

Bus 12 has a low logic-level of about 0 volts but a high logic-level of 3 to 5 volts. Thus older devices such as driver 14, which operate off a 5-volt power supply, drive bus 12 to 0 or 5 volts. Newer devices, such as driver 16, operate off a 3-volt power supply and drive bus 12 to 0 or 3 volts. Thus a high logic-level output from driver 14 will be about 5 volts, while a high logic-level output from driver 16 will be about 3 volts. Newer 3-volt drivers such as driver 10 must be able to connect to bus 12 even when bus 12 is at 5 volts, which is 2 volts higher than the power supply of 3 volts powering driver 10. Since bus 12 operates at high speeds, it is not feasible to mechanically disconnect a driver in a high-impedance state from bus 12, as with a mechanical relay. Electrical circuit means are needed to isolate a driver in a high-impedance state from bus 12.

FIG. 2 is an output buffer using CMOS transistors and gates that can be placed in a high-impedance state. A large n-channel driver transistor 20 pulls bus 12 low, to ground or 0 volts, when it is turned on. The body terminal of transistor 20 is connected to ground, as indicated by the dashed line coming from the channel of transistor 20. Since the source of transistor 20 is also connected to ground, once the gate voltage exceeds the n-channel threshold voltage of about 0.7 volts, transistor 20 will turn on and conduct between its drain (tied to bus 12), and its source (ground).

The gate of transistor 20 is driven by inverter 22, which is driven by NAND gate 26. The output of NAND gate 26 is low, and thus transistor 20 drives bus 12 low, when the enable signal EN is high and the input voltage $V_{IN}$ is high.

A large p-channel driver transistor 18 pulls bus 12 high, to the power supply or 3 volts, when it is turned on. The body terminal of p-channel transistor 18 is connected to the power supply, as indicated by the dashed line coming from the channel of transistor 18. Since the source of transistor 18 is also connected to the power supply, once the gate voltage is less than the power supply by the magnitude of the p-channel threshold voltage of about −0.7 volts, transistor 18 will turn on and conduct between its source (the power supply), and its drain (tied to bus 12).

The gate of p-channel transistor 18 is driven by inverter 24, which is driven by NOR gate 28. The output of NOR gate 28 is high, and thus p-channel transistor 18 drives bus 12 high, when the inverse enable signal $\overline{EN}$ is low and the input voltage $V_{IN}$ is low. Thus $V_{IN}$ is inverted and driven out on bus 12 when the enable signals EN, $\overline{EN}$ are active (1 and 0, respectively).

Isolation Difficult

Isolating a high-impedance driver using only CMOS transistors has proven to be a difficult problem. Isolating n-channel transistor 20 of FIG. 2 is easily accomplished by driving zero volts on its gate. The gate-to-source voltage is thus 0 volts, which is less than the n-channel threshold voltage of about 0.7 volts. Thus n-channel transistor 20 will not conduct, regardless of whether 3 volts or 5 volts is applied to bus 12, which is coupled to the drain of transistor 20. Since the p-well or p-substrate of n-channel transistor 20 is also connected to ground, as indicated by the body terminal or transistor 20 being tied to ground, the parasitic diode between the n+ drain and the p-substrate will be reverse biased at both 3 and 5 volts on the drain. Thus there would be only a very small leakage current from the n+ drain or the channel or n-channel transistor 20. However, isolating the p-channel transistor 18 when bus 12 is at 5 volts is problematic. This isolation problem of the prior art is illustrated in FIG. 3 which shows a crosssection of p-channel driver transistor 18 of FIG. 2. P-channel transistor 18 has a gate 36, a source 38, and a body terminal 40 all tied to the power supply of 3 volts. Thus n-well 32 is at 3 volts because of the connection of the n+ well tap or body terminal 40 to the n-well 32. The p-substrate 34 is biased to ground by a p+ substrate tap (not shown).

When bus 12 is being driven to 5 volts by another driver, little or no current should be drawn from bus 12 through p+ drain 30 as the device should be put in a high-impedance state. However, very large currents can be drawn through p+ drain 30. Two mechanisms can draw current. First, p-channel transistor 18 will turn on and conduct through channel 41 between p+ source 38 and p+ drain 30. P-channel transistor 18 turns on because the 5 volts on p+ "drain" 30 is 2 volts above the 3 volt gate voltage on gate 36. Thus p+ "drain" 30 reverses roles and act as a source, while p+ "source" 38 acts as the drain, since it is at 3 volts. Thus p-channel transistor 18 is turned on and conducts current from bus 12 to the 3-volt power supply connected to p+ "source" 38. This can be a large current because transistor 18 is a large driver transistor that must drive the relatively high-capacitance bus 12. Transistor 18 could draw tens of milli-amps (mA's), depending upon the size of transistor 18. In the second mechanism, the p+ drain 30 within n-well 32 forms a parasitic diode 42. This diode 42 is forward biased, since p+ drain 30 is at 5 volts while n-well 32 is at 3 volts. Thus diode 42 is forward biased by 2 volts and can draw significant current. This current can trigger latch-up in a parasitic SCR formed by a parasitic PNP transistor of the p+ drain 30 as the emitter, n-well 32 base, and p-substrate 34 as a collector, and a second parasitic NPN transistor formed from n+ terminal 40 as the collector, p-substrate 34 as the base, and another n+ drain or source as the emitter (not shown) in the p-substrate.

Charge Pump is Expensive and Body Effect Lowers Performance

A second 5-volt power supply could be used for the output buffer. However, this is expensive as additional 5-volt supply pins are needed on the device. One solution is to use a charge pump to generate a 5-volt pumped signal from the 3-volt power supply. The 5-volt pumped signal is then connected to the gate 36 and the n-well 32, shutting off the p-channel transistor 18 and the parasitic diode 42. However, the charge pump draws current from the 3-volt power supply as an oscillator is required for the pump. The charge pump often requires a large area on the device, increasing cost. The pumping action can add noise to the device, which can particularly be a concern when the device includes analog circuitry.

Performance of any p-channel transistors in the n-well biased to 5 volts can also be reduced due to the well-known body effect. Increasing the body bias from 3 volts to 5 volts increases the channel width necessary for the p-channel transistors to compensate for the body effect.

It has been proposed to use an operational-amplifier comparator to drive the N-well to the greater of Vcc and the output's voltage. (See National Semiconductor's 1994 CrossVolt ™ Low Voltage Series Databook, page 1-13) However, such operational-amplifier comparators are slow and complex.

What is desired is an output buffer that is operated by a 3-volt power supply, and yet can be put in a high-impedance state and not draw significant current when the bus is being driven by another driver to 5 volts. The output buffer should be implemented entirely in CMOS without using bipolar transistors. It is desired to avoid using a charge pump, a second power-supply voltage, or a complex op-amp comparator. It is desired to bias the n-well only to 3 volts to maintain performance of transistors in the n-well and only raise the n-well to a higher voltage for isolation.

SUMMARY OF THE INVENTION

A 3-volt, all-CMOS output buffer drives a bus that can operate at 3 volts and 5 volts. When put in a high-impedance state, the output buffer draws little or no current. If the bus is driven to 5 volts by an external device, the high-impedance output could latch-up since it only has a 3-volt power supply and does not use a charge pump. A biasing circuit couples an N-well that contains p-channel transistors and a driver transistor to the bus driven to 5 volts. Thus the N-well is also driven to 5 volts, the voltage on the bus. The gate of the p-channel driver transistor in the high-impedance output buffer is also coupled to the N-well by another p-channel transistor, raising the gate potential to 5 volts. Thus the gate and body of the p-channel driver transistor is at 5 volts, eliminating leakage or latch-up triggers.

The output buffer has a high-impedance state. The output buffer is coupled to a first power supply which produces a first power supply voltage. The output buffer comprises an output coupled to a bus which has a low logic state and a high logic state. The high logic state corresponds to a voltage substantially at the first power supply voltage when the output buffer is driving the bus, but the high logic state corresponds to a voltage substantially at a second power supply voltage higher than the first power supply voltage when the output buffer is not driving the bus and the output buffer is in the high-impedance state.

A p-channel driver transistor has a source coupled to the first power supply and a drain coupled to the output. The p-channel driver transistor pulls the output high to the first power supply voltage. The p-channel driver transistor is in an N-well.

A bias circuit comprises a well bias means which is coupled to the first power supply and the output. The well bias means is for biasing the N-well. The well bias means couples the N-well to the first power supply when the output buffer is driving the bus, but it couples the output to the N-well when the output buffer is not driving the bus and the bus is substantially at the second power supply voltage higher than the first power supply voltage.

Thus the N-well containing the p-channel driver transistor is biased to substantially the second power supply voltage when the bus is substantially at the second power supply voltage.

In further aspects of the invention, the output buffer has an isolation engaging means that is coupled to the well bias means. It signals when the N-well is to be isolated from the first power supply and coupled to the output. The isolation engaging means is also coupled to the output and signals that the N-well is to be isolated from the first power supply when the bus is substantially at the second power supply voltage.

The isolation engaging means comprise an isolation detect means that receives an indication that the output buffer is not driving the bus. The isolation detect means also receives an indication that the bus is in the high logic state, and indicates when the N-well is to be isolated from the first power supply. A signal inversion means is coupled to the isolation detect means and signals that the N-well is to be isolated from the first power supply. The signal inversion means produces a signal substantially at the second power supply voltage when the isolation detect means indicates that the N-well is to be isolated from the first power supply. It does this by coupling the output to the well bias means.

In further aspects the signal inversion means is a p-channel transistor with a gate coupled to the isolation detect means, a source connected to the output and a drain coupled to the well bias means. The isolation detect means comprises a NAND gate that has a p-channel transistor with a source coupled to the first power supply. The well bias means has a first p-channel pull-up transistor with a gate coupled to the first power supply, a source connected to the output, and a drain coupled to the N-well. The first p-channel pull-up transistor couples the N-well to the output when the bus is substantially at the second power supply voltage. The well bias means also has a second p-channel pull-up transistor with a gate coupled to the signal from the signal inversion means, a source connected to the first power supply, and a drain coupled to the N-well. Thus the second p-channel pull-up transistor couples the first power supply to the N-well when the output buffer is driving the bus.

In still further aspects of the invention the second power supply voltage is greater than the first power supply voltage by at least a magnitude of a p-channel transistor threshold voltage. The bias circuit further has a gate bias means for biasing a gate of the p-channel driver transistor when the output buffer is not driving the bus. A transmission gate means is for isolating the gate of the p-channel driver transistor when the output buffer is in the high-impedance state and the bus is substantially at the second power supply voltage higher than the first power supply voltage.

Thus both the N-well and the gate of the p-channel driver transistor is isolated by the bias circuit. In other aspects all p-channel transistors in the bias circuit are in the same N-well as the p-channel driver transistor. This eliminates latch-up triggers and leakage without using a charge pump.

DETAILED DESCRIPTION

The present invention relates to an improvement in CMOS output buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
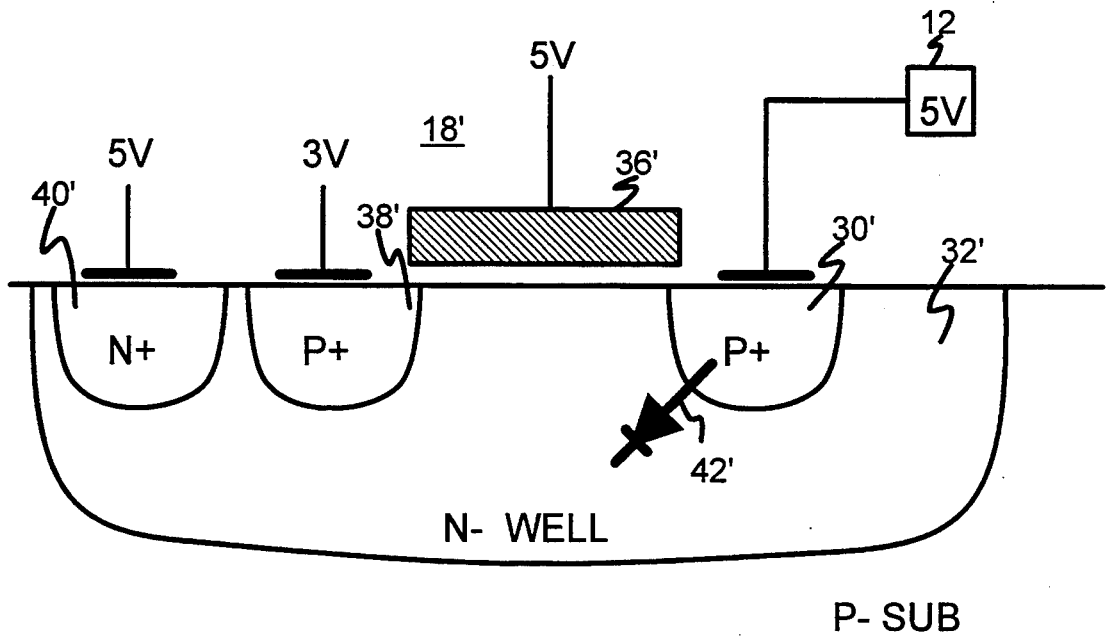
FIG. 4 is cross-section of a p-channel driver transistor 18' being biased for isolation with the biasing circuitry of the present invention.

FIG. 4 is cross-section of a p-channel driver transistor 18' being biased for isolation with the biasing circuitry of the present invention. The gate 36' of transistor 18' is biased to 5 volts rather than just to 3 volts. This prevents a channel from forming under gate 36', which also prevents transistor 18' from turning on and conducting current. Additionally, n-well 32' is biased to 5 volts rather than just 3 volts. Biasing circuitry that will be shown in FIG. 5 drives 5 volts to well tap or body terminal 40'. Source 38' is coupled to the normal 3-volt power supply. Thus the parasitic diode 42' is biased to 0 volts when 5 volts is applied to drain 30' by a 5-volt device driving bus 12. Since parasitic diode 42' requires about 0.3 to 0.7 volts of forward bias to turn on and conduct, parasitic diode 42' does not conduct.

Figure 1:
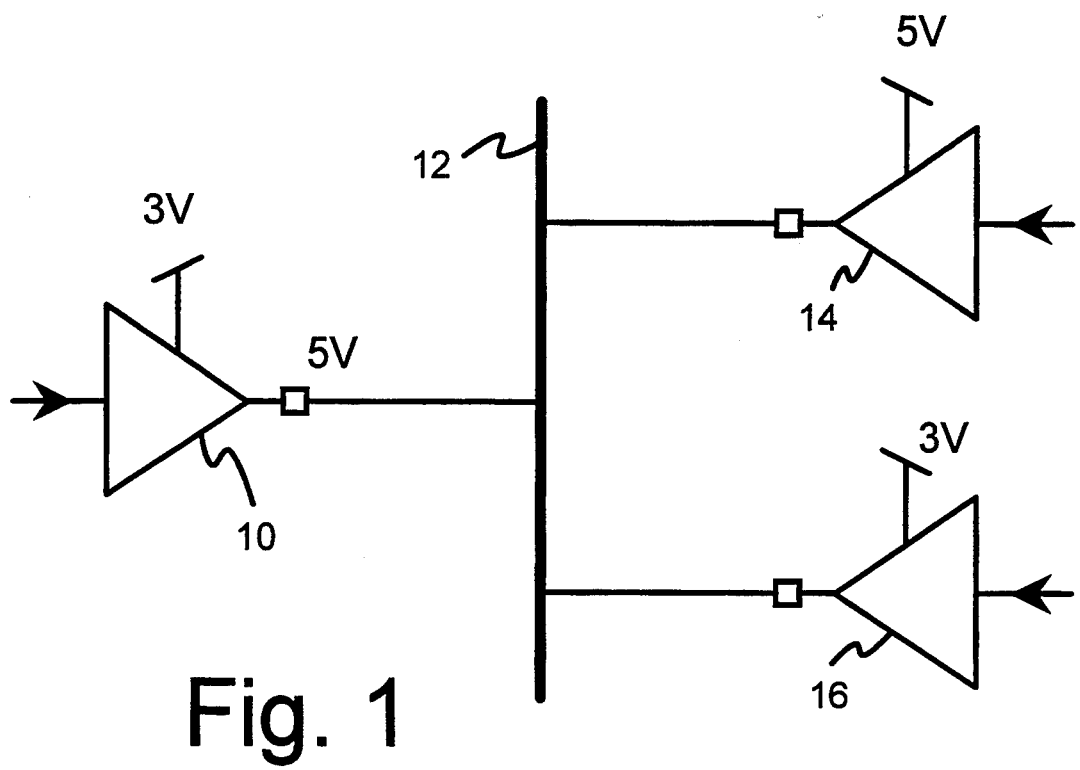
FIG. 1 illustrates a bus that is driven by both 3-volt and 5-volt devices.
Figure 2:
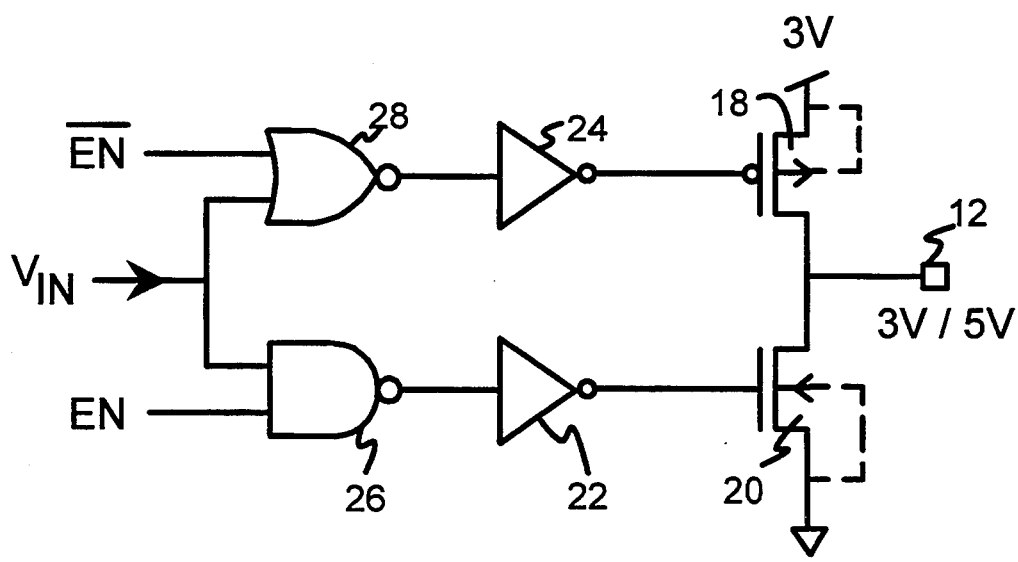
FIG. 2 is a high-impedance output buffer using CMOS transistors and gates.
Figure 3:
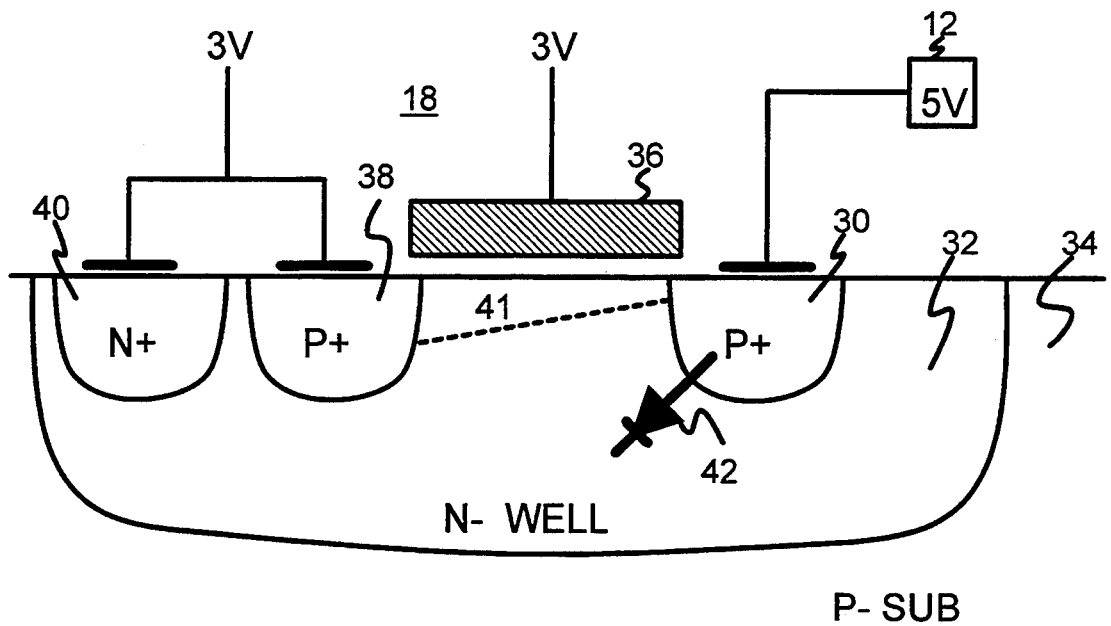
FIG. 3 shows a cross-section of p-channel driver transistor 18 of FIG. 2.
Figure 5:
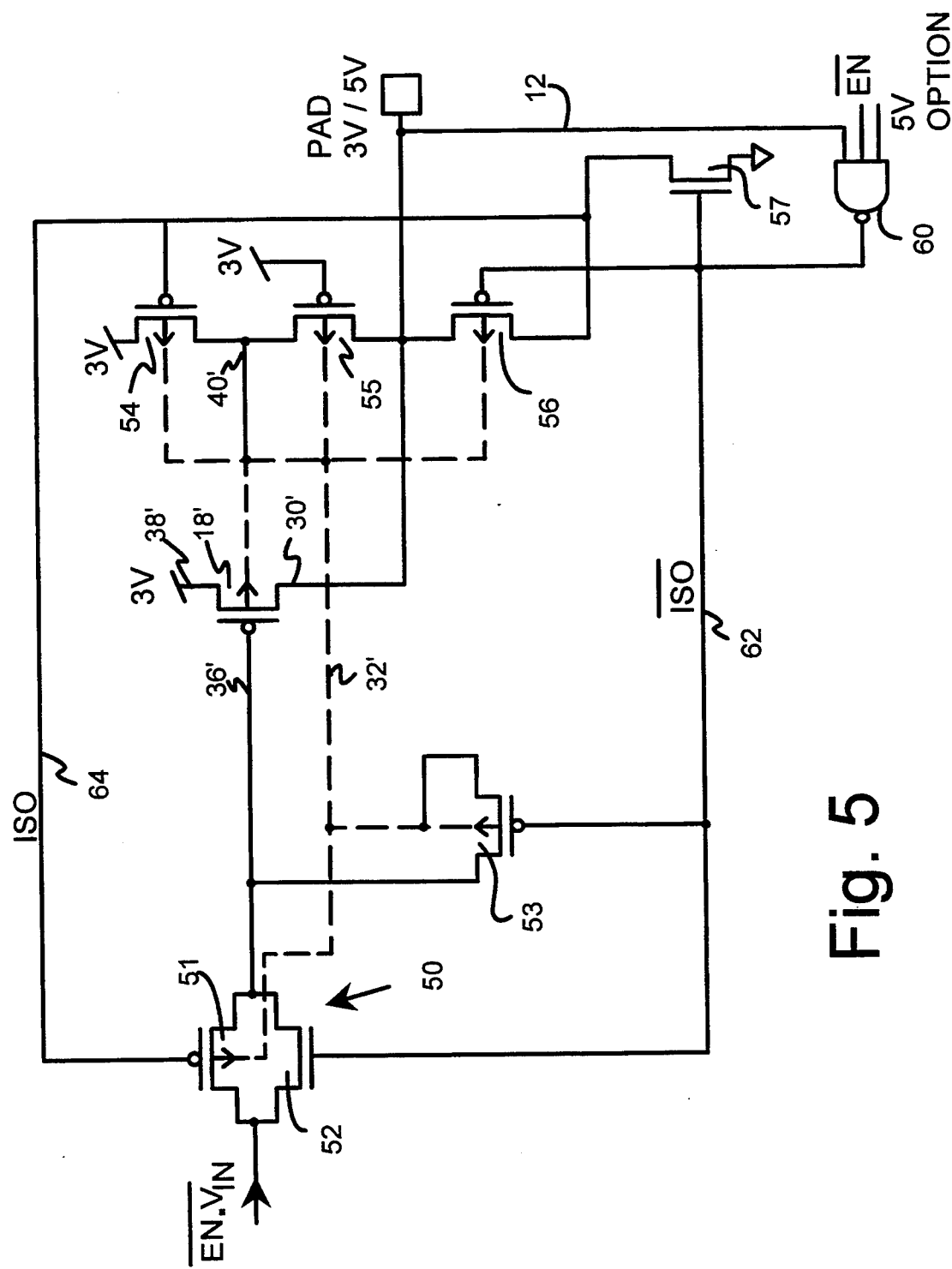
FIG. 5 shows the biasing circuit of the present invention.

FIG. 5 shows the biasing circuit of the present invention. Bus 12 is input to the circuit and coupled to the drain 30' of p-channel driver transistor 18'. An n-channel driver transistor (not shown) has its drain also coupled to bus 12. This n-channel driver transistor is not shown in FIG. 5 because no special biasing is needed for the n-channel driver transistor. Indeed, the prior-art high-impedance output buffer of FIG. 2 can be used with the present invention merely by replacing p-channel driver transistor 18 with the biasing circuit of FIG. 5. The output from inverter 24 of FIG. 2 is the EN*$V_{IN}$ input to transistors 51, 52 which form transmission gate 50.

Transmission gate 50 is provided to isolate gate 36' of p-channel driver transistor 18', since this gate is biased to 5 volts for isolation. Thus transmission gate 50 prevents the 5 volt isolation signal on gate 36' from being connected to the EN*$V_{IN}$ input and the rest of the circuitry on the device. The drain of transistor 53 is coupled to gate 36' to drive 5 volts onto gate 36' during isolation.

Isolation is necessary when NAND gate 60 receives a high logic signal from bus 12, the output buffer is disabled as indicated by signal $\overline{EN}$ being high, and the "5-volt option" signal is high. The 5-volt option signal can be a signal that is programmable. For example, an output buffer using the present invention could have a pin or programmable register that indicates bus 12 uses 5 volts or 3 volts as the high logic level. Thus a single device IC could be used for either 3 volt or 5 volt busses, eliminating the need for a customer to stock both a 3-volt and a 5-volt IC. Alternately, if bus 12 has both 3-volt and 5-volt drivers, the 5-volt option signal could be dynamically switched high when a 5-volt driver is driving bus 12. Often an address decode can determine if a 5-volt device is driving the bus. An address bus could contain the address of the 5-volt device, indicating that the 5-volt device is going to drive bus 12. Another possibility is to have a 5-volt detector driving the 5-volt option signal high when bus 12 is actually at 5 volts, or above 3 volts.

When all of its input are high, indicating that isolation is necessary, NAND gate 60 drives node 62 low. When isolation is not necessary, when any of the inputs to gate 60 are low, then node 62 is driven high. Node 62 is inverted as node 64 by transistors 57, 56, which receive node 62 on their gates while their drains drive node 64. The source of transistor 56 is coupled to bus 12, rather than the 3-volt power supply so than node 64 may be driven to 5 volts when bus 12 is driven to 5 volts, rather than just 3 volts. P-channel transistors 54, 55 drive the n-well 32' through n-well tap 40'. Transistor 54 is turned on and drives the n-well 32' to 3 volts when isolation is not signaled, when node 64 is low. However, when isolation is signaled by node 64 being high, then transistor 54 is turned off. Instead, p-channel transistor 55 turns on as its source, which is coupled to bus 12, surpasses its 3-volt gate voltage by the magnitude of the p-channel threshold voltage. When bus 12 is below $3+|V_{tp}|$ volts, then transistor 55 is cut off and does not conduct. Thus as the voltage on bus 12 rises above about 3.7 volts, transistor 55 couples n-well 32' to the voltage on bus 12 from the 5-volt driver.

The body terminals of p-channel transistors 51, 53, 54, 55, 56, and the p-channel driver transistor 18' are all electrically connected because they are formed in the same n-well 32'. This connection is shown by the dashed line 32' connecting the body terminals of these transistors in FIG. 5. Metal well straps and additional n+ well taps such as 40' may be placed between and near these transistors to reduce the parasitic resistance of the n-well 32'.

OPERATION

The operation of the biasing circuit of FIG. 5 will now be described. Table 1 below shows that the circuit exists in two basic states: the isolation state when the output buffer is put in a high-impedance state and the N-well and gate are coupled to the higher voltage, and the normal operating state. The reference numbers in the first column of Table 1 correspond to the reference numbers of the transistors in FIG. 5.

| Transistor/Signal Reference No. | Function | Normal Op State | Isolation State |
|---|---|---|---|
| 62 | Not ISOlation | High | Low |
| 64 | ISOlation | Low | High |
| 51, 52 | Transmission gate | On | Off |
| 56 | Invert Pullup | Off | On |
| 57 | Invert Pulldown | On | Off |
| 54 | Well Bias 3v | On | Off |
| 55 | Well Bias 5v | Off | On |
| 53 | Gate Bias 5v | Off | On |
| 18' | Driver | On/Off | Off |

When the output buffer is enabled, signal $\overline{EN}$ is low, causing the output of NAND gate 60 to be high. Thus the isolation signal on node 62 is high, which is output from NAND gate 60. Since NAND gate 60 operates with the standard 3-volt power supply, node 62 will be at 3 volts. This 3-volt high signal on node 62 is coupled to the gate of n-channel transistor 57, which turns on, pulling node 64 low to ground. P-channel transistor 56 is off because its gate is also tied to node 62, which is high. Thus transistors 56, 57 node 62 producing node 64, which is low.

The high signal on node 62 turns on n-channel transistor 52, while the low signal on node 64 turns on p-channel transistor 51. Thus transmission gate 50 is on, coupling the EN*$V_{IN}$ input to the gate 36' of p-channel driver transistor 18'. The high signal on node 62 turns p-channel transistor 53 off, so that the n-well is not coupled to gate 36'.

Transmission gate 50 will be turned off, since the gate of n-channel transistor 52 is tied low to node 62, while the gate of p-channel transistor 51 is pulled high by node 64. The n-well 32' will no longer be driven to 3 volts by p-channel transistor 54, which turns off as node 64 goes high. Instead, the n-well 32' will be driven up to 5 volts by p-channel transistor 55, which has its gate tied to 3 volts. As bus 12 rises above $3+|V_{tp}|$ volts, transistor 55 turns on as its source-to-gate voltage rises and exceeds the threshold. N-well tap 40' couples 5 volts from bus 12 to the n-well body terminals of p-channel transistors 51, 53, 54, 55, 56, and 18'. Thus parasitic p+-to-n-well diodes connected to bus 12 will not be forward biased.

In particular, p-channel driver transistor 18' will not draw any D.C. current from a forward-biased parasitic diode at it's drain 30', even though connected to bus 12, since its n-well has been raised up to 5 volts by transistor 55. No second power supply or charge pump is required since bus 12 supplies the 5 volt signal through transistor 55.

P-channel driver transistor 18' will also not draw large currents through its channel because its gate 36' is also driven to 5 volts. The low signal on node 62 turns on p-channel transistor 53, which drives 5 volts onto gate 36' from its source tied to the n-well 32'. Tying transistor 53's source to the n-well 32' rather than directly to bus 12 allows for a slight time delay to charge gate 36'. This allows time for transmission gate 50 to turn off and isolate gate 36' from the rest of the device.

Latch-up is also prevented since all the p-channel transistors that receive 5 volts are in the n-well 32' charged up to 5 volts. Since n-well 32' is charged up by a connection to the bus 12, rather than a charge pump or separate supply, the voltage of n-well 32' will closely follow bus 12. Any variations such as overshoot in the 5-volt high level on bus 12 will not cause latch-up, as could be the case if an independent supply or charge pump were used.

5-Volt Option Signal Not Needed

A 3-volt signal on bus 12 would also trigger NAND gate 60 as the 5-volt signal does. However, the 5-volt option input to NAND gate 60 can be set low if bus 12 was only driven to 3 volts. Thus the 5-volt option signal can be driven to indicate if the bus will be driven to 3 or 5 volts. This is simple if only one external device is driving bus 12. If this external device drives 5 volts, then the 5-volt option signal is set high. Otherwise, if this external device drives 3 volts, then the 5-volt option signal is set low. When several external devices can drive bus 12, and some drive 5 volts while others drive 3 volts, then the 5-volt options signal can be eliminated since the circuit will operate properly and automatically bias the N-well and gate to 5 volts when 5 volts is applied to the output. Thus the 5-volt option signal is not necessary.

ADVANTAGES OF THE INVENTION

The invention achieves isolation of the output buffer without using a charge pump or requiring a second power supply. The higher voltage for isolation is obtained directly from the pin connected to the bus. This results in a lower-cost product as the die area is reduces compared to a charge pump. Only CMOS transistors are needed, so a low-cost CMOS manufacturing process rather than an expensive BiCMOS process can be used.

Since the output buffer uses CMOS drivers, the output will switch rail-to-rail, achieving the maximum possible noise margin. Using an n-channel pullup transistor would severely erode the noise margin which is unacceptable for 3-volt operation. Less power is dissipated since an oscillator is not used as with a charge pump. The p-channel driver transistor has high current drive and thus high performance because its N-well is biased to 3 volts rather than to 5 volts when the transistor is on. The N-well is only biased to 5 volts when isolated and the transistor is off. Thus the driver transistor does not suffer from the body effect with the higher well bias.

The low signal on node 64 turns on p-channel transistor 54, which couples the n-well 32' to the 3-volt internal power supply through well tap 40'. Since bus 12 is not being driven above 3 volts, p-channel transistor 55, whose gate is tied to the 3-volt power supply, is turned off. With both of transistors 55, 56 turned off, only p-channel driver transistor 18' can drive bus 12 high, to 3 volts, and it only drives bus 12 when its gate 36', and the EN*$V_{IN}$ input are low. When EN*$V_{IN}$ is high, then the n-channel driver transistor 20 of FIG. 2 drives bus 12 low, as long as EN is active/high.

Isolation when Bus Driven to 5 Volts

When all inputs to NAND gate 60 are high, 5-volt isolation is required. The output buffer is in a high-impedance state since signal $\overline{EN}$ is high. The 5-volt option signal indicates that bus 12 will be driven to 5 volts rather than just 3 volts when a high is driven by an external device. Although operating from a 3-volt supply, NAND gate 60 also receives bus 12 as an input. Since NAND gate 60 is constructed from CMOS transistors, bus 12 is isolated from the 3-volt power supply since bus 12 is only connected to gates of transistors in NAND gate 60. These gates are typically formed of polysilicon and are separated from the rest of the transistor by gate oxide and insulation. Inputting a 5-volt signal on bus 12 will be seen as a logic one.

If bus 12 is low, then node 62 output from NAND gate 60 will be high, and the circuit will operate in the manner described above, even though it may be in the high-impedance state. However, when bus 12 goes above 3 volts, special isolation is needed. Node 62 output from NAND gate 60 will go low, which will turn off n-channel transistor 57 while turning on p-channel transistor 56, which will drive node 64 high. Since the source of transistor 56 is connected to bus 12 rather than to the 3-volt power supply, node 64 will be charged up to bus 12's voltage, which will reach 5 volts. Thus node 62 will be low, at ground, while node 64 will be high, reaching 5 volts.

ALTERNATE EMBODIMENTS

Several other embodiments are contemplated by the inventors. For example, the layout of the n-well taps and strapping of these well taps can be varied. Separate wells could be used for some of the p-channel transistors such as the driver transistor, while still being biased to the 5-volt potential of the bus. While a connection to an external bus has been described, it is understood that this connection may be made through bonding wires, pins, and pads, or other means. Indeed, the invention could be used on a single substrate between blocks having differing power-supply voltages, in which case the bus could lie entirely within a single device or IC. The exact sizes of the transistors can be varied according to the technology used or design goals or requirements.

The exact power-supply voltages in any particular embodiment can vary. The detailed description has referred to a 3-volt and a 5-volt supply, but the 3-volt supply could easily be replaced with a 3.3-volt or a 3.5-volt supply. Indeed, the invention could be used for adapting a 5-volt output buffer to operate with a 7, 10, or 12-volt bus. Thus the specific voltages used are a matter for those of skill in the art to vary while still falling within the spirit of the invention.

While a single p-channel driver transistor has been described, it would also be feasible to have one bias circuit control the biasing of several driver transistors. Also, the p-channel driver transistor could itself be composed of several individual transistors, such as transistors in parallel or in series.

Transmission gate 50 of FIG. 5 has an n-channel transistor 52 with its gate biased by signal 62, NOT ISOLATION. However, this gate may be permanently biased to the power supply (3 volts), rather than being actively driven high and low. Biasing to 3 volts is possible since the input to transmission gate 50 is high when the output is in the high-impedance state. P-channel driver transistor 18' must have its gate high to isolate during high-impedance. Thus the input to transmission gate 50 will already be high during isolation. Therefore the gate of transistor 52 may simply be tied to the power supply, simplifying layout.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An output buffer having a high-impedance state, the output buffer coupled to a first power supply producing a first power supply voltage, the output buffer comprising:

an output coupled to a bus, the bus having a low logic state and a high logic state, the high logic state corresponding to a voltage substantially at the first power supply voltage when the output buffer is driving the bus, the high logic state corresponding to a voltage substantially at a second power supply voltage higher than the first power supply voltage when the output buffer is not driving the bus and the output buffer is in the high-impedance state;

a p-channel driver transistor, having a source coupled to the first power supply and a drain coupled to the output, the p-channel driver transistor for pulling the output high to the first power supply voltage, the p-channel driver transistor being in an N-well;

a bias circuit comprising well bias means, coupled to the first power supply and coupled to the output, for biasing the N-well, the well bias means coupling the N-well to the first power supply when the output buffer is driving the bus, the well bias means coupling the output to the N-well when the output buffer is not driving the bus and the bus is substantially at the second power supply voltage higher than the first power supply voltage; and isolation engaging means, coupled to the well bias means, for signaling when the N-well is to be isolated from the first power supply and coupled to the output, the isolation engaging means coupled to the output, the isolation engaging means signaling that the N-well is to be isolated from the first power supply when the bus is substantially at the second power supply voltage;

wherein the isolation engaging means comprises:

isolation detect means, receiving an indication that the output buffer is not driving the bus, the isolation detect means also receiving an indication that the bus is in the high logic state, for indicating when the N-well is to be isolated from the first power supply; and signal inversion means, coupled to the isolation detect means, for signaling that the N-well is to be isolated from the first power supply, whereby the N-well containing the p-channel driver transistor is biased to substantially the second power supply voltage when the bus is substantially at the second power supply voltage.

2. The output buffer of claim 1 wherein the signal inversion means produces a signal substantially at the second power supply voltage when the isolation detect means indicates that the N-well is to be isolated from the first power supply.

3. The output buffer of claim 2 wherein the signal inversion means couples the output to the well bias means when the isolation detect means indicates that the N-well is to be isolated from the first power supply, whereby the signal is substantially at the second power supply voltage.

4. The output buffer of claim 3 wherein the signal inversion means comprises a p-channel transistor having a gate coupled to the isolation detect means, the p-channel transistor having a source connected to the output and a drain coupled to the well bias means.

5. The output buffer of claim 1 wherein the isolation detect means comprises a NAND gate, the NAND gate having a p-channel transistor with a source coupled to the first power supply.

6. An output buffer having a high-impedance state, the output buffer coupled to a first power supply producing a first power supply voltage, the output buffer comprising:

an output coupled to a bus, the bus having a low logic state and a high logic state, the high logic state corresponding to a voltage substantially at the first power supply voltage when the output buffer is driving the bus, the high logic state corresponding to a voltage substantially at a second power supply voltage higher than the first power supply voltage when the output buffer is not driving the bus and the output buffer is in the high-impedance state;

a p-channel driver transistor, having a source coupled to the first power supply and a drain coupled to the output, the p-channel driver transistor for pulling the output high to the first power supply voltage, the p-channel driver transistor being in an N-well; and a bias circuit comprising well bias means, coupled to the first power supply and coupled to the output, for biasing the N-well, the well bias means coupling the N-well to the first power supply when the output buffer is driving the bus, the well bias means coupling the output to the N-well when the output buffer is not driving the bus and the bus is substantially at the second power supply voltage higher than the first power supply voltage;

wherein the well bias means comprises:

a first p-channel pull-up transistor, having a gate coupled to the first power supply with a source connected to the output and a drain coupled to the N-well, the first p-channel pull-up transistor coupling the N-well to the output when the bus is substantially at the second power supply voltage whereby the N-well containing the p-channel driver transistor is biased to substantially the second power supply voltage when the bus is substantially at the second power supply voltage.

7. The output buffer of claim wherein the well bias means comprises:

a second p-channel pull-up transistor, having a gate coupled to the signal from the signal inversion means, the second p-channel pull-up transistor having a source connected to the first power supply and a drain coupled to the N-well, the second p-channel pull-up transistor coupling the first power supply to the N-well when the output buffer is driving the bus.

8. The output buffer of claim 6 wherein the second power supply voltage is greater than the first power supply voltage by at least a magnitude of a p-channel transistor threshold voltage.

9. An output buffer having a high-impedance state, the output buffer coupled to a first power supply producing a first power supply voltage, the output buffer comprising:

an output coupled to a bus, the bus having a low logic state and a high logic state, the high logic state corresponding to a voltage substantially at the first power supply voltage when the output buffer is driving the bus, the high logic state corresponding to a voltage substantially at a second power supply voltage higher than the first power supply voltage when the output buffer is not driving the bus and the output buffer is in high-impedance state;

a p-channel driver transistor, having a source coupled to the first power supply and a drain coupled to the output, the p-channel driver transistor for pulling the output high to the first power supply voltage, the p-channel driver transistor being in an N-well; and a bias circuit comprising well bias means, coupled to the first power supply and coupled to the output, for biasing the N-well, the well bias means coupling the N-well to the first power supply when the output buffer is driving the bus, the well bias means coupling the output to the N-well when the output buffer is not driving the bus and the bus is substantially at the second power supply voltage higher than the first power supply voltage:

gate bias means for biasing a gate of the p-channel driver transistor when the output buffer is not driving the bus; and transmission gate means for isolating the gate of the p-channel driver transistor when the output buffer is in the high-impedance state and the bus is substantially at the second power supply voltage higher than the first power supply voltage, whereby the gate of the p-channel driver transistor is isolated by the bias circuit and the N-well containing the p-channel driver transistor is biased to substantially the second power supply voltage when the bus is substantially at the second power supply voltage.

10. The output buffer of claim 9 wherein the gate bias means couples the gate of the p-channel driver transistor to substantially the second power supply voltage when the output buffer is in the high-impedance state and the bus is substantially at the second power supply voltage higher than the first power supply voltage.

11. The output buffer of claim 10 wherein the gate bias means couples the gate of the p-channel driver transistor to the N-well substantially at the second power supply voltage when the output buffer is in the high-impedance state and the bus is substantially at the second power supply voltage higher than the first power supply voltage.

12. The output buffer of claim 11 wherein the gate bias means comprises a p-channel bias transistor having a source connected to the N-well and a drain coupled to the gate of the p-channel driver transistor.

13. The output buffer of claim 12 wherein the N-well contains the p-channel driver transistor and the p-channel bias transistor and all p-channel transistors in the bias circuit.

14. An output buffer having a high-impedance state, the output buffer coupled to a first power supply producing a first power supply voltage, the output buffer comprising:
an output coupled to a bus, the bus having a low logic state and a high logic state, the high logic state corresponding to a voltage substantially at the first power supply voltage when the output buffer is not in the high-impedance state, the high logic state corresponding to a voltage substantially at a second power supply voltage higher than file first power supply voltage when the output buffer is in the high-impedance state;
a p-channel driver transistor, having a source coupled to the first power supply and a drain coupled to the output, the p-channel driver transistor for pulling the output high to the first power supply voltage the p-channel driver transistor being in an N-well;
a bias circuit comprising
gate bias means for biasing a gate of the p-channel driver transistor when the output buffer is in the high-impedance state and the bus is substantially at the second power supply voltage; and
transmission gate means for isolating the gate of the p-channel driver transistor when the output buffer is in the high-impedance state and the bus is substantially at the second power supply voltage higher than the first power supply voltage.

15. The output buffer of claim 14 further comprising:
isolation engaging means, coupled to the gate bias means and the transmission gate means and coupled to the output, for signaling when the gate is to be isolated from the first power supply.

16. An output buffer having a high-impedance state, the output buffer coupled to a first power supply producing a first power supply voltage, the output buffer comprising:
an output coupled to a bus, the bus having a low logic state and a high logic state, the high logic state corresponding to a voltage substantially at the first power supply voltage when the output buffer is not in the high-impedance state, the high logic state corresponding to a voltage substantially at a second power supply voltage higher than the first power supply voltage when the output buffer is in the high-impedance state;
pull-up driver means, coupled to the first power supply and coupled to the output, for pulling the output high to the first power supply voltage, the pull-up driver means having a control gate; and
a bias circuit comprising
gate bias means for biasing the control gate of the pull-up driver means when the output buffer is in the high-impedance state and the bus is substantially at the second power supply voltage; and
transmission gate means for isolating the gate of the p-channel driver transistor when the output buffer is in the high-impedance state and the bus is substantially at the second power supply voltage higher than the first power supply voltage.

* * * * *